United States Patent [19]

Ohshima et al.

[11] Patent Number: 4,998,256

[45] Date of Patent: Mar. 5, 1991

[54] SEMICONDUCTOR LASER APPARATUS

[75] Inventors: Shigeru Ohshima, Yokohama; Mitsuko Nakamura, Kawasaki, both of Japan

[73] Assignee: Kabushiki Kaisha Toshiba, Kawasaki, Japan

[21] Appl. No.: 501,045

[22] Filed: Mar. 29, 1990

[30] Foreign Application Priority Data

| Mar. 30, 1989 | [JP] | Japan | 1-76517 |
| May 25, 1989 | [JP] | Japan | 1-131857 |
| Jul. 13, 1989 | [JP] | Japan | 1-180942 |
| Nov. 17, 1989 | [JP] | Japan | 1-297729 |
| Nov. 20, 1989 | [JP] | Japan | 1-299687 |
| Nov. 21, 1989 | [JP] | Japan | 1-300912 |
| Dec. 5, 1989 | [JP] | Japan | 1-314197 |

[51] Int. Cl.⁵ .................................................. H01S 3/13
[52] U.S. Cl. .................................... 372/32; 372/92; 372/38; 372/34; 372/43
[58] Field of Search .................. 372/32, 29, 87, 38, 372/27, 34, 43

[56] References Cited

U.S. PATENT DOCUMENTS

| 4,821,273 | 4/1989 | Hori | 372/32 |
| 4,907,237 | 3/1990 | Dahmani et al. | 372/32 |
| 4,918,700 | 4/1990 | Gambini | 372/32 |

OTHER PUBLICATIONS

A. D. White, "Frequency Stabilization of Gas Lasers", IEEE J. Quant, Elect., QE-1, pp. 349-357 (1965).
T. Uchida, "Direct Modulation of Gas Lasers", IEEE J. Quant. Elect., QE-1, pp. 336-343 (1965).

Primary Examiner—Léon Scott, Jr.
Attorney, Agent, or Firm—Oblon, Spivak, McClelland, Maier & Neustadt

[57] ABSTRACT

In a semiconductor laser apparatus of the invention, a laser beam emitted from a semiconductor laser is collimated by an optical leans, and is subsequently split by a beam splitter in two directions. One split laser beam component is focused on a first photodetector through an optical lens. The other laser beam component is incident on a Fabry-Perot resonator, and is changed in intensity thereby. The laser beam component is then focused on a photodetector through an optical lens. The Fabry-Perot resonator is integrally designed such that dielectric multilayer films are respectively deposited on both the end faces of a crystalized quartz bulk, which is shaped into a columnar shape extending in the C-axis direction, so as to form a pair of reflect filters. Since the bulk is made of crystalized quartz it is not easily influenced by changes in temperature.

30 Claims, 11 Drawing Sheets

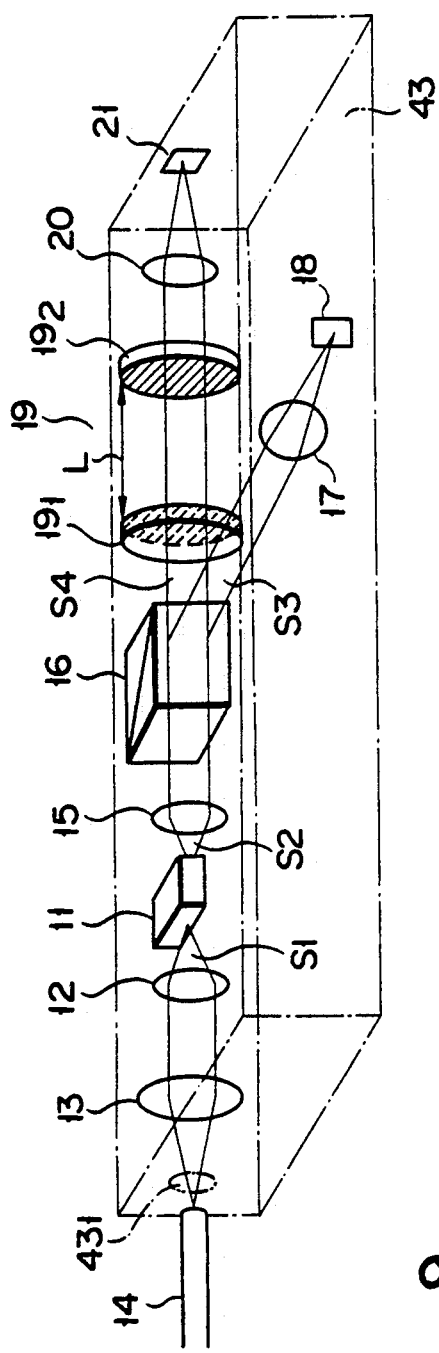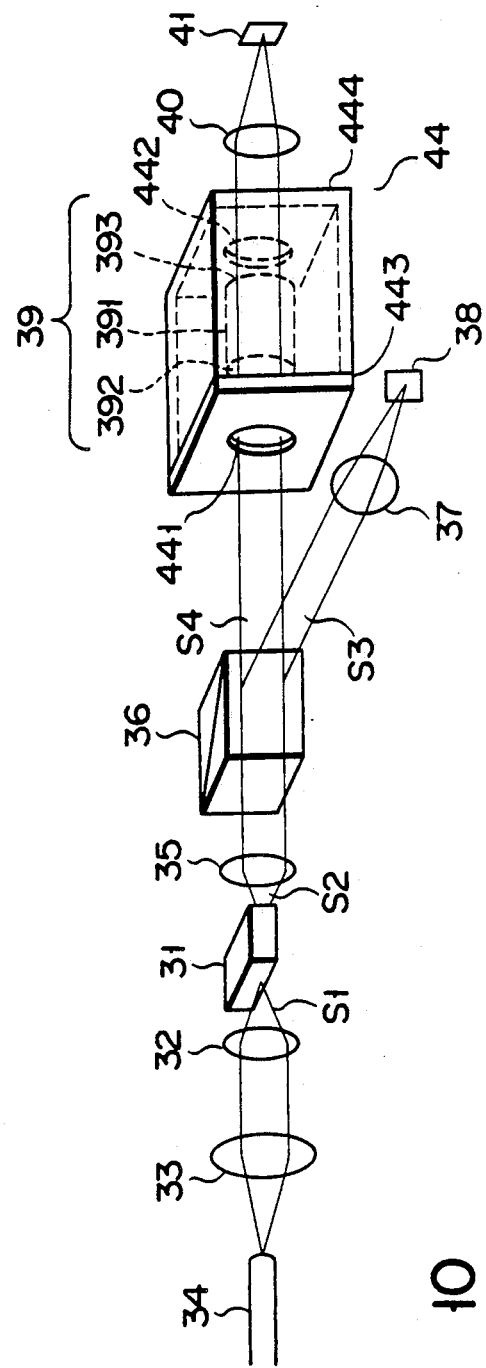
FIG. 9
FIG. 10

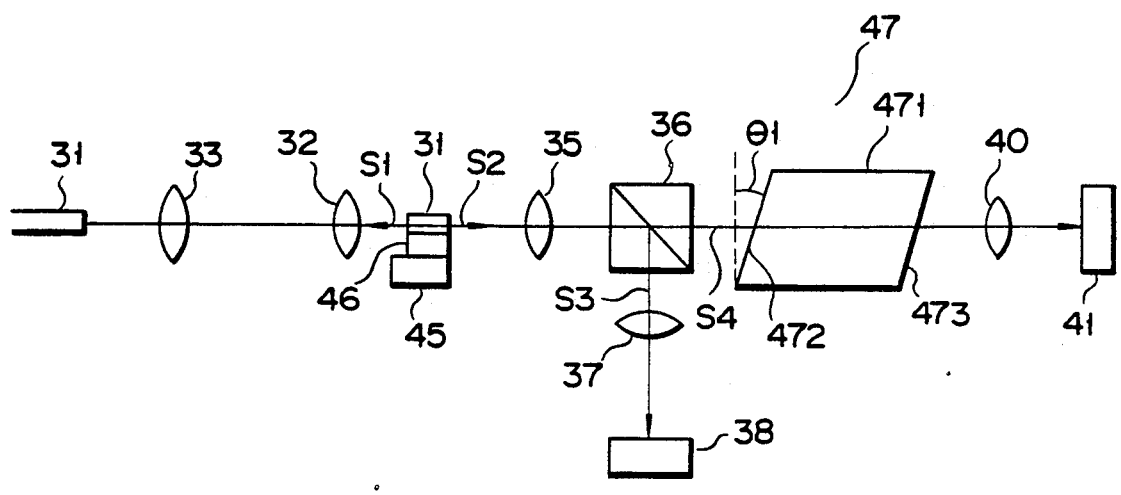
F I G. 11
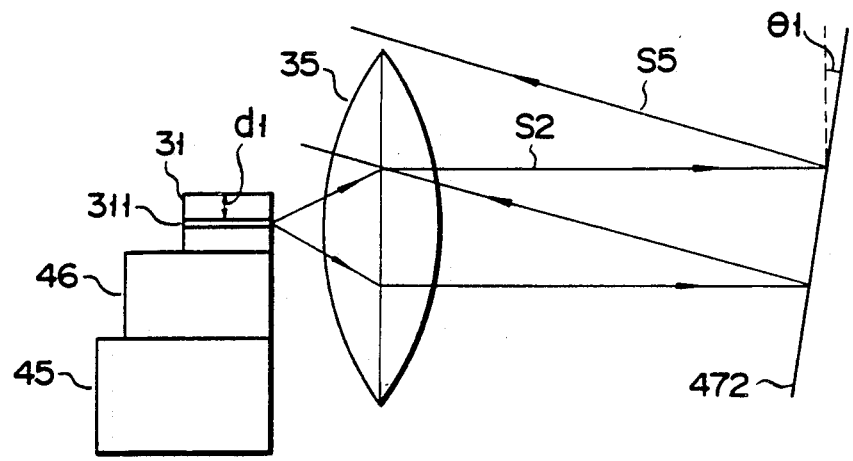
F I G. 12

SEMICONDUCTOR LASER APPARATUS

BACKGROUND OF THE INVENTION

1. Field of the Invention

The present invention relates to a semiconductor laser module and a laser wavelength control apparatus used for optical communication.

2. Description of the Related Art

FIG. 1 shows a conventional semiconductor laser module which can be used for optical communication.

Referring to FIG. 1, reference numeral 11 denotes a semiconductor laser. The oscillation wavelength (oscillation frequency) of the semiconductor laser 11 can be controlled by changing its injection current or temperature. Light $S_1$ emitted from the left side of the semiconductor laser 11 in FIG. 1 is focused on an optical fiber 14 for optical transmission through optical lenses 12 and 13. Light $S_2$ emitted from the right side of the semiconductor laser 11 in FIG. 1 is collimated by an optical lens 15 and is split by a beam splitter 16 in two directions. One split light component $S_3$ is focused on a first photodetector (e.g., a photodiode) 18 through a optical lens 17. The other light component $S_4$ undergoes a change in intensity through a Fabry-Perot resonator 19 and is focused on a second photodetector (e.g., photodiode) 21 through an optical lens 20.

The Fabry-Perot resonator 19 is designed such that a pair of reflecting mirrors 191 and 192 each consisting of a dielectric multilayer film are set parallel and oppose each other at a distance L. The Fabry-Perot resonator 19 has a characteristic that a light intensity is repeatedly changed at a period of a free spectral interval C/2nL (C: light velocity; n: refractive index in the Fabry-Perot resonator) with respect to the frequency of incident light, as shown in FIG. 2. For this reason, light which is incident on the Fabry-Perot resonator 19 undergoes a change in intensity in accordance with its frequency, and a detection output from the second photodetector 21 undergoes a change in level due to the change in intensity. Therefore, the oscillation wavelength of the semiconductor laser 11 can be obtained by measuring a ratio of an output from the first photodetector 18, which receives light free from an intensity change, to an output from the second photodetector 21, which receives light which is changed in intensity.

In the conventional apparatus, therefore, as basically shown in FIG. 3, both outputs from the first and second photodetectors 18 and 21 are input to a feedback control unit 22, and an oscillation wavelength is obtained by the control unit 22 on the basis of the level difference between the outputs. The temperature or injection current of the semiconductor laser 11 is changed in accordance with the obtained oscillation wavelength, thereby controlling the oscillation wavelength of the semiconductor laser 11 to be a desired oscillation wavelength. FIG. 4 shows a relationship between the oscillation wavelength of the semiconductor laser 11 and a detection level difference from the feedback control unit 22, and also shows the wavelength capture range of the control unit 22.

The conventional Fabry-Perot resonator 19 used in the above-described semiconductor laser module must be designed under the following conditions and limitations. In the first place, the two reflecting mirrors 191 and 192 must be arranged with a parallelism on the order of seconds. In the second place, the two reflecting mirrors 191 and 192 must be arranged at the interval L on the order of submicrons. In the third place, the ambient temperatures of the two reflecting mirrors 191 and 192 must be controlled with a precision of 0.1° C. or less because the two reflecting mirrors 191 and 192 and their holder (not shown) expand or contract depending on changes in temperature and humidity so as to change the distance L. In the last place, the positions of the two reflecting mirrors 191 and 192 tend to shift from each other due to an external impact. Because of these limitations, the Fabry-Perot resonator 19 is difficult to manufacture. In addition, the Fabry-Perot resonator 19 tends to exhibit variations in characteristics and is susceptible to variation due to external factors. Therefore, stable control of the wavelength of the semiconductor laser is difficult.

In the above-described means for controlling the wavelength of a semiconductor laser, a set wavelength is not located at the center of the wavelength capture range, as shown in FIG. 4. Since the wavelength capture range cannot be effectively used for stable feedback control, such a means is difficult to operate. Especially, if the fineness of the Fabry-Perot resonator 19 is increased to improve its sensitivity, this tendency becomes more conspicuous. Therefore, the sensitivity is difficult to improve. In addition, since control by this means is performed in a DC manner, its operation is susceptible to drifts. That is, the set wavelength precision is affected not only by changes in sensitivity of the photodetectors 18 and 21, changes in sensitivity of an amplifier, arranged in the feedback control unit 22, for amplifying an input signal, and a O-point drift but also by changes in light amount due to dust and the like in an optical path. For this reason, it is very difficult to stabilize a set wavelength over a long period of time.

SUMMARY OF THE INVENTION

It is an object of the present invention to provide a semiconductor laser apparatus which allows stable and easy control of the oscillation wavelength of a semiconductor laser, is not easily influenced by temperature and humidity as external factors, and is resistant to changes in quality over years.

A semiconductor laser apparatus comprises a semiconductor laser for emitting a laser beam, a Fabry-Perot resonator including a crystallized quartz bulk having two flat surfaces which are perpendicular to a C-axis direction and parallel and opposite to each other, the Fabry-Perot resonator being provided with dielectric multilayer films respectively deposited on the flat surfaces so as to form reflect filters, and the crystallized quartz bulk being arranged on an optical axis of one of laser beams emitted from the semiconductor laser in such a manner that the C-axis direction is parallel to the optical axis of said semiconductor, thereby detecting a wavelength of incident light; and a photodetector for receiving and photoelectrically converting light which is transmitted through the Fabry-Perot resonator.

A semiconductor laser apparatus comprises a semiconductor laser for emitting a laser beam, a Fabry-Perot resonator which is designed such that two types bulks having different temperature coefficients are bonded to each other to be formed into a bulk assembly, dielectric multilayer films are respectively deposited on two flat surfaces of said bulk assembly, which are formed to be parallel and opposite to each other through bonding surfaces of said bulks, so as to form reflect filters, said bulk assembly being arranged on an optical axis of one of laser beams emitted from said semiconductor laser in such a manner that the flat surfaces are perpendicular to the optical axis of said semiconductor, thereby detecting a wavelength of incident light; and a photodetector for receiving and photoelectrically converting light which is transmitted through said Fabry-Perot resonator.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a view showing an arrangement of the fourth embodiment of a semiconductor laser module according to the present invention;

FIG. 10 is a view showing an arrangement of the fifth embodiment of a semiconductor laser module according to the present invention;

FIG. 11 is a view showing an arrangement of the sixth embodiment of a semiconductor laser module according to the present invention;

FIGS. 12 and 13 are enlarged views of part of the arrangement of the module in FIG. 11;

DETAILED DESCRIPTION OF THE PREFERRED EMBODIMENTS

Figure 5:
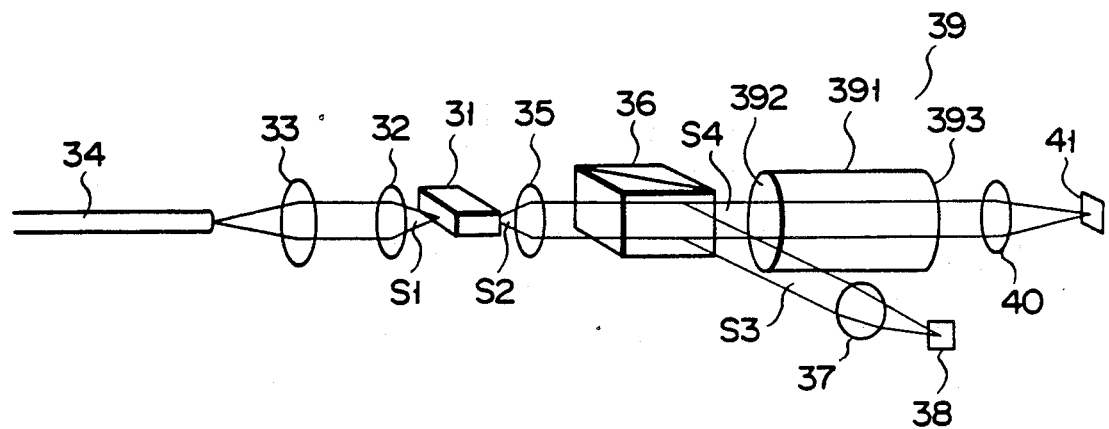
FIG. 5 is a view showing an arrangement of the first embodiment of a semiconductor laser module according to the present invention.

FIG. 5 shows the first embodiment of a semiconductor laser module according to the present invention. Referring to FIG. 5, reference numeral 31 denotes a semiconductor laser. By changing the injection current or temperature of the semiconductor laser 31, wavelength control in a 1.55-$\mu$m wavelength band can be performed. Light $S_1$ emitted from the left side of the semiconductor laser 31 in FIG. 5 is focused on an optical fiber 34 for optical transmission through optical lenses 32 and 33. Light $S_2$ emitted from the right side of the semiconductor laser 31 in FIG. 5 is collimated by an optical lens 35 and is split by a beam splitter 36 in two directions. One split light component $S_3$ is focused on a first photo-detector (e.g., a photodiode) 38 through an optical lens 37. A detection output from the first photodetector 38 is used as a power monitor output. The other split light component $S_4$ is transmitted through a Fabry-Perot resonator 39 consisting of a crystallized quartz etalon whose C axis is matched with an optical axis of the semiconductor laser 31, and is focused on a second photodetector (e.g., a photodiode) 41 through an optical lens 40.

The Fabry-Perot resonator 39 is designed such that reflect filters 392 and 393 are respectively formed by depositing dielectric multilayer films on both the end faces (top and bottom surfaces) of a bulk 391 which is shaped to extend in the C-axis direction in the form of a column. The parallelism of the surfaces 392 and 393 and a distance L therebetween depend on only the shaping precision of the bulk 391. The bulk 391 can be shaped on the order of seconds in terms of angles and on the order of submicrons in terms of lengths. Any consideration need not be given to a positional shift of the two reflect filters 392 and 393 due to an external impact. In addition, since the reflect filters 392 and 393 are formed on the solid body of the crystallized quartz bulk 391, they are not easily influenced by temperatures.

An optical length L between the two reflect filters 392 and 393 as a function of temperature can be represented by the following equation:

$$L = \{n_0 + (dn/dT) \cdot T\} \cdot L_0 \cdot (1 + \alpha T) = n_0 \cdot L_0 [1 + T \cdot \{\alpha + (1/n_0) \cdot (dn/dT)\}] \quad (1)$$

where $n_0$ is the refractive index of the crystallized quartz at $T = 0$, $dn/dT$ is an amount of change in refractive index with respect to the temperature, T is the temperature, $L_0$ is the physical length of the etalon at $T = 0$, and $\alpha$ is a linear expansion coefficient. According to equation (1), the influence of changes in temperature on the optical length L is reduced as the following value is decreased:

$$\alpha + (1/n_0) \cdot (dn/dT)$$

In this case, $$\alpha + (1/n_0) \cdot (dn/dT) = \gamma \quad (2)$$

The value $\gamma$ of fused silica which is often used for an etalon is about $7 \times 10^{-6}$/deg. In contrast to this, the crystallized quartz exhibits a very small value $\gamma$ about $3 \times 10^{-6}$/deg, when light is incident in the C-axis direction. Therefore, by using the crystallized quarty bulk 391, a wavelength detecting precision of 0.1 Å or less can be ensured at about 1° C.

As described above, a Fabry-Perot resonator consisting of a crystallized quartz etalon uses a Z-cut crystallized quartz The temperature coefficient $\gamma(\gamma = \alpha + (1/n) \cdot (dn/dT)$, where $\alpha$: a linear expansion coefficient; n: a refractive index; dn/dT: an amount of change in refractive index with respect to a temperature change) of the Z-cut crystallized quartz is about $3 \times 10^{-6}$/deg. Therefore, even the Fabry-Perot resonator using the Z-cut crystallized quartz having a relatively small temperature coefficient cannot satisfy the demand for temperature control with a precision of 0.1° C. or less.

Figure 6:
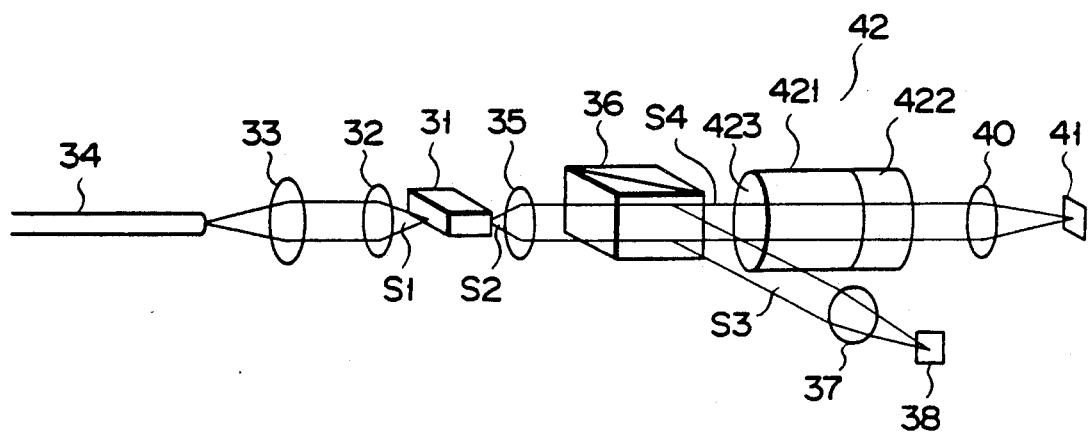
FIG. 6 is a view showing an arrangement of the second embodiment of a semiconductor laser module according to the present invention.

FIG. 6 shows a semiconductor laser module according to the second embodiment of the present invention, which is designed to solve the above-described problem. The same reference numerals in FIG. 6 denote the same parts as in FIG. 5, and a description thereof will be omitted.

The semiconductor laser module shown in FIG. 6 is different from that shown in FIG. 5 in the structure of a Fabry-Perot resonator 42. This Fabry-Perot resonator 42 is designed as follows. A columnar bulk 421 consisting of a first optical material (crystallized quartz in this case) and a columnar bulk 422 consisting of a second optical material (rutile in this case) are bonded to each other in such a manner that their C axes are positioned in the same direction. Dielectric multi-layer films are then respectively deposited on both the end faces of the resultant structure, thus forming reflect filters 423 and 424.

Figure 7:
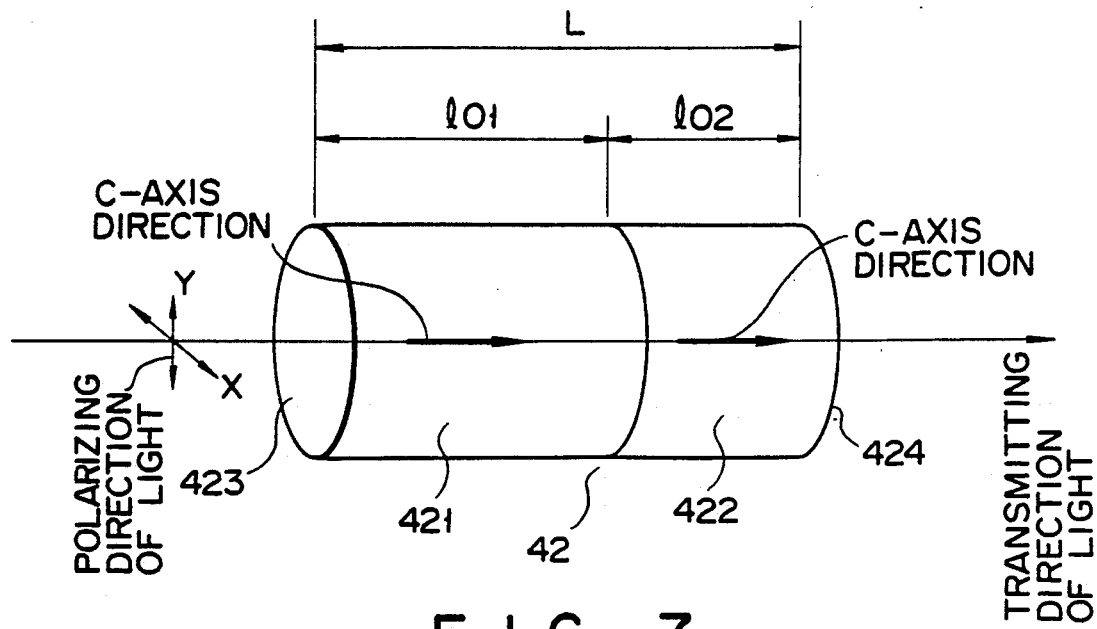
FIG. 7 is an enlarged view of a Fabry-Perot resonator in FIG. 6.

FIG. 7 shows an enlarged view of the Fabry-Perot resonator 42. As shown in FIG. 7, the length of the Fabry-Perot resonator 42 is represented by L. The length L can be represented by the following equation:

$$L = n_{01} l_{01}[1 + T \cdot \{\alpha_1 + (1/n_{01}) \cdot (dn_1/dT)\}] + n_{02} l_{02}[1 + T \cdot \{\alpha_2 + (1/n_{02}) \cdot (dn_2/dT)\}] \quad (3)$$

where T is a temperature, $n_{01}$ and $n_{02}$ are the refractive indexes of the crystal and the rutile at T=0, $dn_1/dT$ and $dn_2/dT$ are respectively amounts of change in refractive index with respect to the temperatures of the crystallized quartz and rutile, 101 and 102 are respectively the physical lengths of the crystallized quartz and rutile at T=0, and $\alpha_1$ and $\alpha_2$ are respectively the linear expansion coefficients of the crystallized quartz and rutile.

In equation (3), if the coefficient part (temperature coefficient) of the temperature T of the crystallized quartz is given as $\gamma_1$, and that of the rutile is given as $\gamma_2$, the following equation can be established:

$$n_{01} l_{01} \{\alpha_1 + (1/n_{01}) \cdot (dn_1/dt) + n_{02} l_{02} \alpha_2 + (1/n_{02}) \cdot (dn_2/dT)\} = n_{01} l_{01} \gamma_1 + n_{02} l_{02} \gamma_2 \quad (4)$$

If the solution of equation (4) is 0, even if T in equation (3) is changed, the length L is not changed. In order to obtain the temperature coefficients $\gamma_1$ and $\gamma_2$, the following numbers are substituted into equations (3) and (4):

$$n_{01} = 1.53, \alpha_1 = 0.8 \times 10^{-5}, dn_1/dT = -7 \times 10^{-6},$$
$$n_{02} = 2.4, \alpha_2 = 0.9 \times 10^{-5}, dn_2/dT = -4 \times 10^{-5}$$

Then, the temperature coefficients $\gamma_1$ and $\gamma_2$ are given as equations (5) and (6):

$$\gamma_1 \approx 3 \times 10^{-6}/deg \quad (5)$$

$$\gamma_2 \approx 8 \times 10^{-6}/deg \quad (6)$$

Each temperature coefficient is obtained when light is transmitted through the C axis of each optical material. As is apparent from equations (5) and (6), the absolute value of $\gamma_2$ is about 2.7 times that of $\gamma_1$. Therefore, if the physical lengths 101 and 102 of the optical materials are adjusted to establish the following equation (7), the length L of the Fabry-Perot resonator 42 can be set to be constant with respect to variations in temperature:

$$n_{01} l_{01} : n_{02} l_{02} = 2.7 : 1 \quad (7)$$

In the above embodiment, the two optical materials are bonded to each other such that their C-axis directions coincide with each other. However, these directions need not always coincide with each other. For example, the present invention can be equally applied to a case wherein a rutile bulk as a second optical material and a crystallized quartz bulk as a first optical material are bonded to each other in such a manner that the C axis of the second optical material is perpendicular to that of the first optical material. In this case, if light is polarized in an X direction in FIG. 7, since $$n_{02} = 2.65, \alpha_2 = 0.7 \times 10^{-5}, \text{ and } dn_2/dT = -4 \times 10^{-5},$$

the temperature coefficient of the rutile is about $-19 \times 10^{-6}$/deg. If light is polarized in a $\gamma$ direction, since $$n_{n2} = 2.65, \alpha_2 = 0.7 \times 10^{-5}, \text{ and } dn_2/dT = -7 \times 10^{-5},$$

the temperature coefficient of the rutile is about $-10 \times 10^{-6}$/deg. Therefore, if the ratio of $n_{01} l_{01}$ and $n_{02} l_{02}$ is set to be 6.3:1 when incident light is polarized in the X direction, and the ratio is set to be 3.3:1 when incident light is polarized in the Y direction, the length L of the Fabry-Perot resonator can be kept constant with respect to changes in temperature, thus enabling stable wavelength control of a semiconductor laser.

In the semiconductor laser module having the above-described arrangement, since the Fabry-Perot resonator is constituted by two optical materials having different temperature coefficients, the length of the resonator does not vary with respect to changes in temperature. Hence, the oscillation wavelength of the semiconductor laser can be very stably controlled.

In the above embodiment, crystallized quartz and rutile are used as optical materials constituting the Fabry-Perot resonator. However, the present invention can be applied to a case wherein a Fabry-Perot resonator is constituted by a combination of fused silica and rutile. In addition, if a Fabry-Perot resonator is constituted by a combination of other optical materials having different temperature coefficients, the same effect as described above can be obtained. Furthermore, in the first and second embodiments, columnar bulks are exemplified. However, the shape of a bulk is not limited to this. For example, the present invention can be applied to a case wherein a hexahedral bulk is used.

In a conventional apparatus, a half reflecting mirror used for a Fabry-Perot resonator consists of a dielectric multilayer film having a packing density of about 0.9. It is known that the wavelength characteristics of this dielectric multilayer film having a packing density of 0.9 shift depending on a humidity in air. In the conventional apparatus, however, a half reflection mirror having such a packing density is considered to be sufficient for a Fabry-Perot resonator for the following reasons:

(1) The characteristics of a Fabry-Perot resonator are given as follows:

$$\beta = 4\pi n L \cdot \cos\theta / \lambda$$

$$F = \pi \sqrt{R}/(1-R)$$

where $\beta$ is a phase difference of the Fabry-Perot resonator, $\theta$ is the incident angle of light radiated on the Fabry-Perot resonator, F is the fineness of the Fabry-Perot resonator, and R is the reflectivity of a reflecting mirror. According to these equations, the wavelength axis of the characteristics is influenced by only $nL \cdot \cos\theta$ and does not depend on a wavelength shift of the multilayer film.

(2) The reflectivity characteristics of a dielectric multilayer film used for the Fabry-Perot resonator are gradually changed with changes in wave-length. Therefore, even if a wavelength shift of the multilayer film occurs due to a humidity change, a change in reflectivity is very small, and no problem is posed.

It was found from high-precision experiments on the above-described points that the refractive index of a dielectric multilayer film constituting a reflecting mirror was changed by 5 to 6% due to the influences of humidity. This changed the phase of a reflected wave, and hence the wavelength characteristics of the resonator shifted. If the wavelength characteristics of the Fabry-Perot resonator shift, the oscillation wavelength of a semiconductor laser using the wavelength of the resonator as a reference wavelength shifts accordingly. Therefore, a stable operation of the Fabry-Perot resonator with respect to humidity cannot be performed. Since humidity is generally associated with temperature, a resonator which has poor humidity stability tends to have poor temperature stability. Since a reflect filter is also constituted by a dielectric multilayer film in the above-described embodiments, the same problems as described above are posed.

Figure 8:
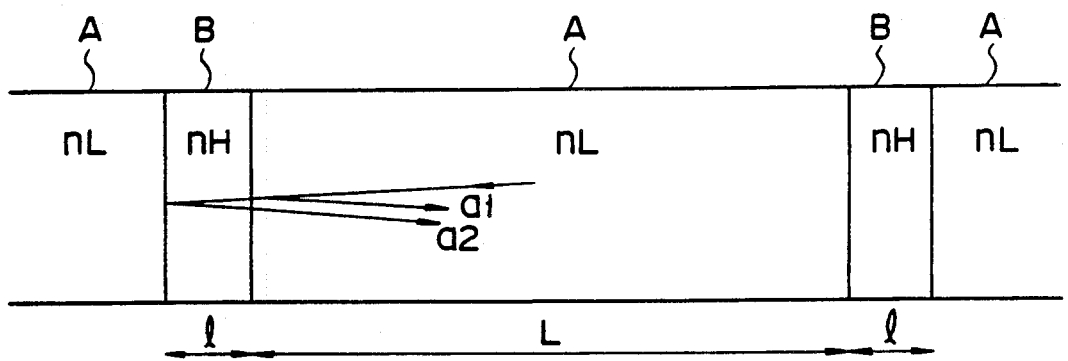
FIG. 8 is a view, showing an arrangement of a Fabry-Perot resonator, for explaining the third embodiment of a semiconductor laser module according to the present invention.

FIG. 8 is a view, showing reflect filters consisting of the above-described dielectric multilayer film of a semiconductor laser module according to the third embodiment of the present invention, for explaining a means for stabilizing the wavelength of a semiconductor laser by reducing changes in refractive index due to humidity and suppressing a shift of wave-length characteristics of a resonator.

That is, FIG. 8 shows a Fabry-Perot resonator as a simple model, in which dielectric single-layer films B each having a refractive index $n_H$ and an optical length $l = \pi/4$ are respectively formed on both the end faces of a substance A (air in a conventional apparatus and the crystallized quartz bulk in the first embodiment) having a refractive index $n_L$ and a length L.

The dielectric single-layer film B is porous, and its refractive index nH is given by the following equation:

$$(n_H^2 - n_S^2)/(n_H^2 + 2n_S^2) = (1-P)\{(1-f)(n_V^2 - n_S^2)/(n_V^2 + 2n_S^2) + f(n_W^2 - n_S^2)/(n_W^2 + 2n_S^2)\} \quad (8)$$

where $n_S$ is the refractive index of a thin-film material, $n_V$ is the refractive index of a void ($=1$), $n_W$ is the refractive index of an absorptive material ($=1.33$), P is a packing density, and f is the occupation ratio of the absorptive material to the void. As is apparent from equation (8), f is changed with a change in humidity, and $n_H$ is changed with this change. In this case, the thickness of the single-layer film is given is l its wavelength is given as $\lambda$, and the refractive index $n_H$ at $f=0$ is given as $n_{H0}$, and these factors are set to establish the following equation:

$$l = \lambda / 4 n_{H0}$$

In FIG. 8, reflected light components $a_1$ and $a_2$ will be considered. $a_1$ and $a_2$ can be regarded as complex amplitudes of the reflected light components, and the following relation can be established:

$$|a_1| \approx |a_2| = (n_H - n_L)/(n_H + n_L) \equiv a$$

If $a_1$ and $a_2$ are obtained in this relation, $$a_1 = ae^{j(\omega t + \pi)} \quad (9)$$

$$a_2 = ae^{j(\omega t + 2 n_H l \times 2/\lambda)} = ae^{j\{\omega t + \pi(1+\delta)\}} \quad (10)$$

where $n_H/n_{H0} = 1 + \delta$. According to equations (9) and (10):

$$a_1 + a_2 = ae^{j(\omega t + \pi)}(1 + e^{j\pi\delta})$$

Therefore, as the refractive index $n_H$ of the single-layer film is changed, the phase of a reflected wave is changed by about $\pi\delta/2 (|\pi\delta| << 1)$.

As described above, in a Fabry-Perot resonator, a shift of the wavelength characteristics due to a phase deviation of a reflected wave from a reflect filter is more influential than a change in reflection coefficient a by 1%. In the present invention, a wavelength shift of a semiconductor laser due to such a phase shift is considered as an important problem. If a wavelength shift amount is $\partial\lambda$, $\partial\lambda = (\delta/h)\partial h = \lambda^2 \delta / 4h$ (11)

where h is an effective resonator length. In this case, ti $h = nL$ $\partial h = (\lambda/2\pi)(\pi\delta/2) = \lambda\delta/4$ With the substitution of actual numbers, i.e., $h = 2$ mm, $\lambda = 1.5$ $\mu$m, and $\delta = 0.05$, $\partial\delta$ is 0.14 Å. This corresponds to a variation of 2.5% of a free space spectral interval ($\lambda^2/2h$).

The above-description is associated with a single-layer film. A phase change amount is increased almost in proportion to the number of layers, and a wavelength shift is also increased. In contrast to this, variations in reflection amount due to humidity tend to be suppressed in a multilayer film as compared with a single-layer film, and hence a wavelength shift poses a greater problem. Under the circumstances, in the present invention, each reflect filter of a Fabry-Perot resonator is constituted by a dielectric multilayer film having a packing density of 0.98 or more. As is apparent from equation (8), a change in refractive index due to humidity is reduced with an increase in packing density. Therefore, a phase change of a reflected wave from the reflect filter can be suppressed with an increase in packing density. With a decrease in length of a Fabry-Perot in particular, the amount of wavelength shift is increased, as is apparent from equation (11). Therefore, such a dielectric multilayer film is very effective for a resonator having a length of 5 mm or less.

If each reflect filter of a Fabry-Perot resonator is constituted by a dielectric multilayer film having a packing density of 0.98 or more, the wavelength characteristics of the resonator can be stabilized, thereby stabilizing the oscillation wavelength of a semiconductor laser in a semiconductor laser wavelength control apparatus incorporating this resonator. In addition, since the humidity is a function of temperature, the stability of the apparatus having the above-described arrangement with respect to temperatures can be improved.

Note that dielectric multilayer films are formed by an electron beam depositing apparatus, a sputtering apparatus, or the like. In order to form a dielectric multilayer film having a high packing density, each apparatus must be improved to some degree. Similar to this embodiment, even if each reflect filter of a Fabry-Perot is constituted by a dielectric multilayer film having a packing density of 0.98 or more in the embodiments shown in FIGS. 5 and 6, the same effect can be obtained.

Instead of using the above-described means for suppressing a shift of the wavelength characteristics of a Fabry-Perot, a means for reducing a change in refractive index of a resonator due to the environmental humidity of the resonator may be considered.

FIG. 9 shows an arrangement of the fourth embodiment of a semiconductor laser module according to the present invention, which is designed to reduce a change in refractive index of the Fabry-Perot resonator due to the environmental humidity of the resonator and to suppress a shift of resonator wavelength characteristics, thereby stabilizing the wavelength of a semiconductor laser. The same reference numerals in FIG. 9 denote the same parts as in FIG. 1, and a description thereof will be omitted.

Reflecting mirrors 191 and 192 of a Fabry-Perot resonator 19 in this embodiment are respectively constituted by dielectric multilayer films. As described above, therefore, the phase of reflected light is changed due to the influences of humidity. As a result, the wavelength characteristics of the Fabry-Perot resonator 19 are shifted. In this embodiment, therefore, in order to air-tightly seal the Fabry-Perot resonator 19, the entire module is housed in a package 43. In order to allow radiation of a laser beam $S_1$ onto an optical fiber 14, a window 431 is formed at the radiation position of the package 431. The window 431 consists of, e.g, glass or sapphire, and its peripheral portion is sealed.

In such an arrangement, no moisture enters or escapes from the package 43, and hence the humidity with respect to the Fabry-Perot resonator 19 is constant. Since a semiconductor laser module generally performs temperature control by using a Peltier element or the like, if the moisture content and temperature in the package 43 are constant, the humidity has a constant value. If, however, no temperature control is performed, constant humidity cannot be set even with a constant moisture content. In such a case, a dry, high-purity inert gas or nitrogen may be sealed in the package 43.

In the semiconductor laser module having the above-described arrangement, since the humidity with respect to the Fabry-Perot resonator 19 is constant, the refractive indexes of the reflecting mirrors 191 and 192 can be set to be constant. If, therefore, the above-described laser wavelength control apparatus is arranged in this module, the oscillation wavelength of a semiconductor laser 11 can be detected with high precision, and a laser beam having a stable wavelength can be obtained.

In the above embodiment, the present invention is applied to the semiconductor laser module using a general Fabry-Perot resonator. However, the present invention can be equally applied to a semiconductor laser module using a Fabry-Perot resonator consisting of etalon shown in FIGS. 5 and 6. In addition, the package need not necessarily cover the entire module but may be designed to cover only the Fabry-Perot resonator whose humidity change especially influences stability of a wavelength. Furthermore, a better effect can be obtained by combining this embodiment with the third embodiment described with reference to FIG. 8.

FIG. 10 shows an arrangement of the fifth embodiment of a semiconductor laser module according to the present invention, which is designed to reduce a change in refractive index of the above-described Fabry-Perot resonator due to its own humidity and suppress a shift of the resonator wavelength characteristics, thereby stabilizing the wavelength of a semiconductor laser. The same reference numerals in FIG. 10 denote the same parts as in FIG. 5, and a description thereof will be omitted.

A Fabry-Perot resonator 39 consisting of the above-described etalon is designed such that dielectric multilayer films are respectively deposited on both the end faces of a crystal bulk 391 so as to form reflect filters 392 and 393. In this case, the phase of reflected light is changed when the dielectric multi-layer film is influenced by humidity, and the wavelength characteristics of the Fabry-Perot resonator are shifted. In this embodiment, therefore, in order to air-tightly seal the Fabry-Perot resonator 39, the resonator is housed in a package 44. The package 44 is constituted by lids 443 respectively including windows 441 and 442 and a casing 444. The Fabry-Perot resonator 39 is housed and fixed in the casing 444. The lids 443 and the casing 444 are sealed together to air-tightly seal the Fabry-Perot resonator 39. The windows 441 and 442 are formed to allow incidence and emergence of light, and consist of glass, sapphire, or the like. The peripheral portion of each window is sealed.

A characteristic feature of this arrangement will be described below. In the embodiment shown in FIG. 9, if a high-purity gas is filled in the package 43, the wavelength characteristics upon assembly of the module are shifted. In this embodiment, however, since the Fabry-Perot resonator 39 is housed in the package, and is subsequently attached to the semiconductor laser module, even if the wavelength characteristics of the Fabry-Perot resonator housed in the package 44 are shifted, its wavelength characteristics can be set by only adjusting the incident angle at the time of attachment of the resonator to the semiconductor laser module. According to the arrangement of this embodiment, therefore, in addition to the effect of the embodiment in FIG. 9, another effect can be obtained, i.e., complicated adjustment after assembly of the module can be omitted.

In this embodiment, the Fabry-Perot resonator consisting of etalon is housed in the package. However, this embodiment can be equally applied to a conventional Fabry-Perot resonator consisting of a pair of reflecting mirrors. In addition, a better effect can be obtained by combining this embodiment with the third embodiment described with reference to FIG. 8.

In the first embodiment shown in FIG. 5, when the reflect filter 392 of the Fabry-Perot resonator 39 is perpendicular to the optical axis of incident light, light which is incident on the Fabry-Perot resonator 39 is reflected by the reflect filter 392 and is returned to the end face of the semiconductor laser 31 or the end face of a sub-mount on which the semiconductor laser 31 is mounted. As a result, the oscillation frequency of the semiconductor laser 31, the intensity of a laser beam, and the like become unstable. As the reflect filter 392 of the Fabry-Perot resonator 39 is inclined with respect to the optical axis, an amount of light which is transmitted through the resonator 39 is decreased, and the fineness is degraded. Therefore, as the inclination angle of the reflect filter 392 is increased, an amount of light which is incident on the photodetector 41 as a frequency detection monitor is decreased, and hence is disadvantageous in terms of wavelength stability.

FIG. 11 shows the sixth embodiment which is designed to solve this problem. The same reference numerals in FIG. 11 denote the same parts as in FIG. 5, and a description thereof will be omitted.

A semiconductor laser 31 is mounted on a sub-mount 46 on a laser system 45. Light $S_2$ emitted from one side of the semiconductor laser 31 is split by a beam splitter 36. One split light component $S_3$ is received by a first photodetector 38 through an optical lens 37. The other split light component $S_4$ is incident on a Fabry-Perot resonator 47 consisting of a crystallized quartz etalon and having substantially the same arrangement as that shown in FIG. 5. Although reflect filters 472 and 473 respectively formed on both the end faces of a crystallized quartz bulk 471 of the Fabry-Perot resonator 47 are parallel to each other, they are not perpendicular to the optical axis of the incident light $S_4$ and are inclined at a certain angle. The light which is transmitted through the Fabry-Perot resonator 47 is received by a second photodetector 41 through an optical lens 40. Outputs from the first and second photodetectors 38 and 41 are used for control of stabilizing the wavelength of the semiconductor laser 31 through the above-described feedback control.

Figure 2:
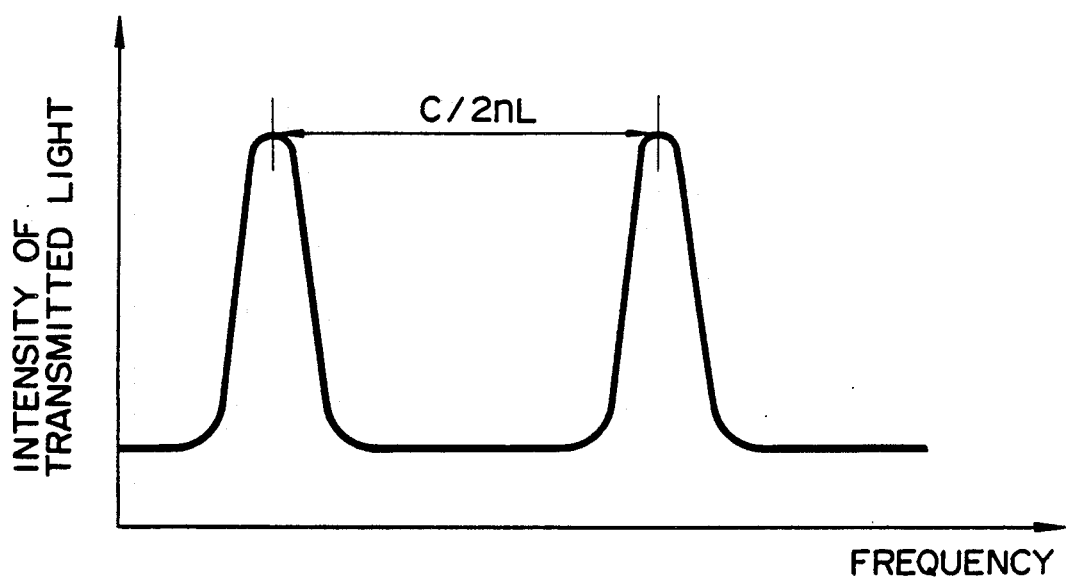
FIG. 2 is a graph showing the light intensity characteristics of a Fabry-Perot resonator in FIG. 1 with respect to the frequency of incident light.
Figure 3:
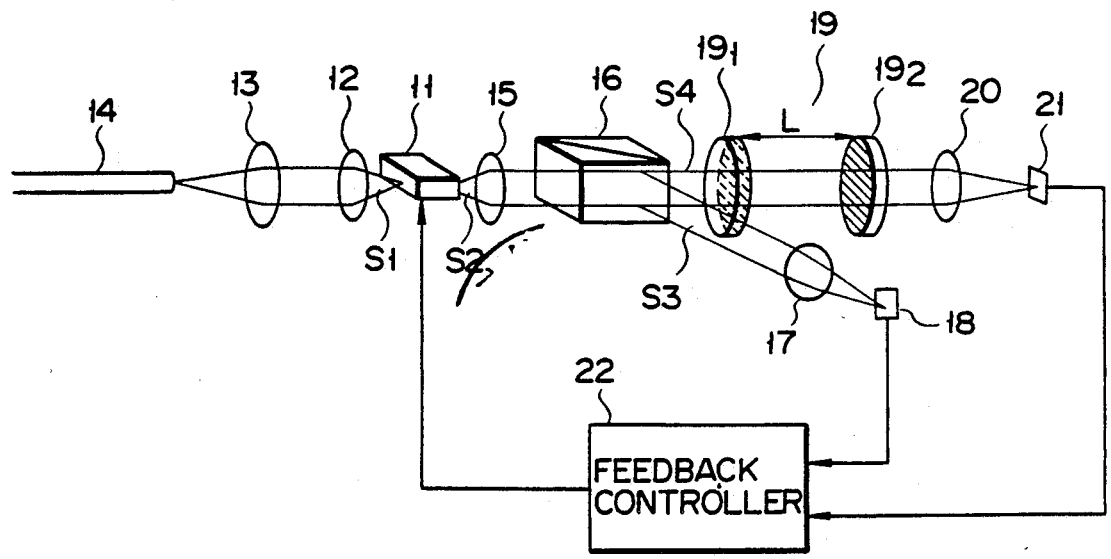
FIG. 3 is a view showing an arrangement of a laser oscillation wavelength control apparatus of the conventional semiconductor laser module.
Figure 4:
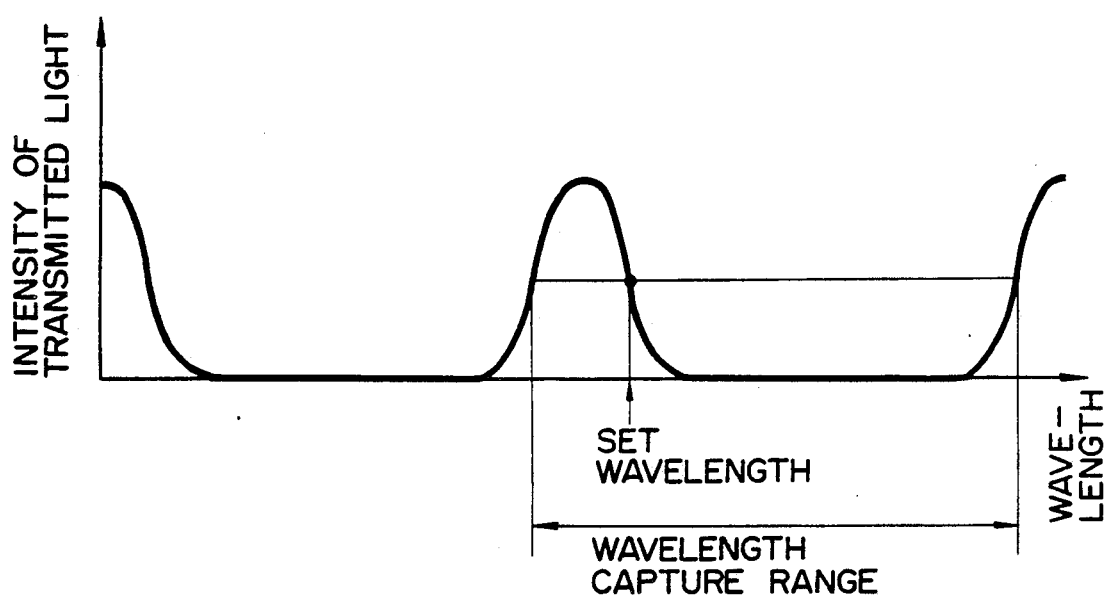
FIG. 4 is a graph showing a relationship between the oscillation wavelength of a semiconductor laser controlled by the control apparatus in FIG. 3 and a detection level difference obtained by a feedback control unit, and showing the wavelength capture range of the feedback control unit.

An operation performed when the reflect filters 472 and 473 of the Fabry-Perot resonator 47 are inclined as in FIG. 11 will be described below with reference to FIG. 12. FIG. 12 shows an enlarged view of the semiconductor laser 31, the optical lens 35, and the reflect filter 472 of the Fabry-Perot resonator 47. For the sake of a simple description, the beam splitter 36 is omitted from FIG. 2.

Referring to FIG. 12, light $S_5$ reflected by the reflect filter 472 of the Fabry-Perot resonator 47 does not return to the end face of the sub-mount 46 on which the semiconductor laser 31 is mounted because of the inclination of the reflect filter 472 but returns to the module space opposite to the side on which the semiconductor laser 31 is mounted. In this case, an inclination angle $\theta_1$ of the reflect filter 472 with respect to the vertical plane of the optical axis is set as follows:

$$\theta_1 > d_1/2f \tag{12}$$

where $d_1$ is the distance from the upper surface of the semiconductor laser 31 to an active layer 311 as shown in FIG. 12, and f is the focal length of the optical lens 35. The inclination angle $\theta_1$ is set to be equal to that of the other reflect filter 473 so as to cause the axis of incident and output light components on and from the Fabry-Perot resonator 47 to be parallel to each other.

Figure 13:
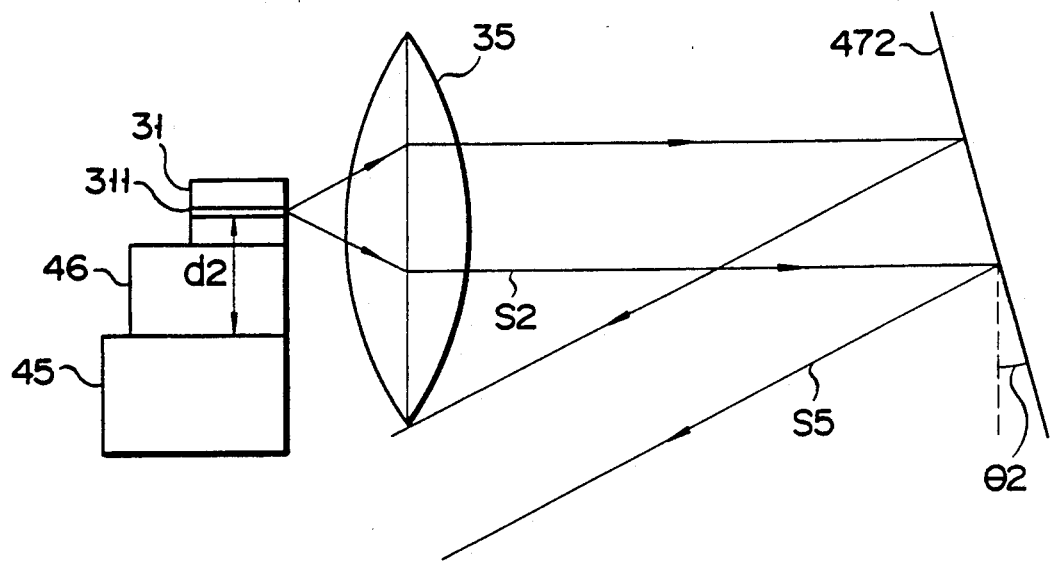

When the reflect filters 472 and 473 of the Fabry-Perot resonator 47 are inclined at $\theta_1$ as defined by inequality (12), light from the semiconductor laser 31 returns to the module space opposite to the side on which the semiconductor laser 31 is mounted. Therefore, the light does not return to the end face of the semiconductor laser 31 or the end face of the sub-mount 46. In this case, since $d_1$ is very small, only a small inclination angle $\theta_1$ is required. This prevents a great reduction in amount of light transmitted through the resonator 47 and degradation in fineness. As shown in FIG. 13 (the same reference numerals in FIG. 13 denote the same parts as in FIG. 12, and a description thereof will be omitted), the reflect filters 472 and 473 may be inclining in the opposite direction to that in FIG. 12. In this case, an inclination angle $\theta_2$ may be set as follow:

$$\theta_2 > d_2/2f \tag{13}$$

where $d_2$ is the distance from the active layer 311 of the semiconductor laser 31 to the lower surface of the sub-mount 46 as shown in FIG. 13. In this case, light $S_5$ reflected by the reflecting surface 472 returns to a lower side than the lower surface of the sub-mount 46 but does not return to the end face of the semiconductor laser 31 or the end face of the sub-mount 46.

In the semiconductor module having the above-described arrangement, since the reflect filters of the Fabry-Perot resonator on which a laser beam is incident are properly inclined, reflected light does not return to the end face of the semiconductor laser or the end face of the sub-mount. Therefore, a reduction in amount of transmitted light can be minimized, and stabilization of the wavelength of the semiconductor laser can be realized without degrading the fineness.

Figure 14:
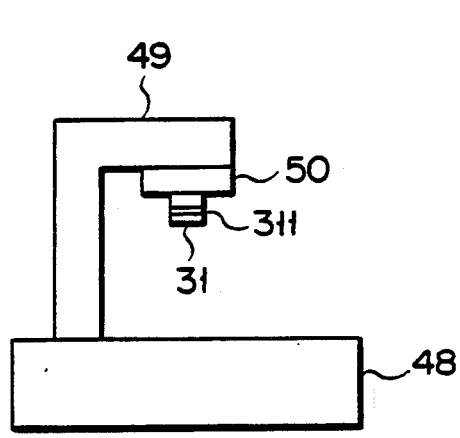
FIGS. 14 and 15 are views respectively showing modifications of the sixth embodiment.
Figure 15:
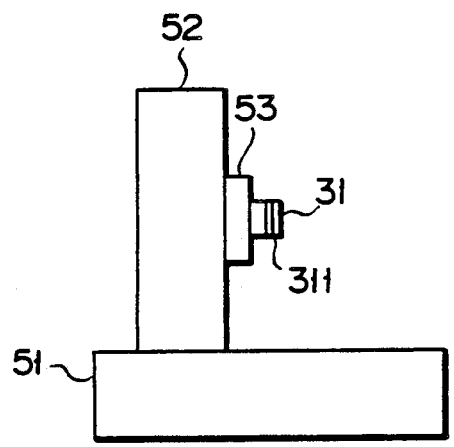

Even if the mount position of the semiconductor laser 31 is changed as shown in FIGS. 14 and 15, the reflect filters 472 and 473 of the Fabry-Perot resonator 47 may be inclined on the basis of inequality (12) or (13) so as not to cause the reflected light $S_5$ to return to the end face of the semiconductor laser 31 or of the sub-mount. Note that in FIGS. 14 and 15, reference numerals 48 and 51 denote module bases; 49 and 52, laser stems; and 50 and 53, sub-mounts.

In the above-described embodiment, the reflect filters 472 and 473 of the Fabry-Perot resonator 47 are inclined. However, the same effect as described above can be obtained by using the Fabry-Perot resonator 39 shown in FIG. 5 without any modification, and including the entire body of the resonator at a predetermined angle. It is apparent that the Fabry-Perot resonator used in this embodiment can have any shape as long as the relation represented by inequality (12) or (13) is satisfied. Therefore, this embodiment can be equally applied to, e.g., a hexahedral Fabry-Perot resonator. In addition, the same effect as described above can be obtained from a combination of the second to fifth embodiments.

Figure 16:
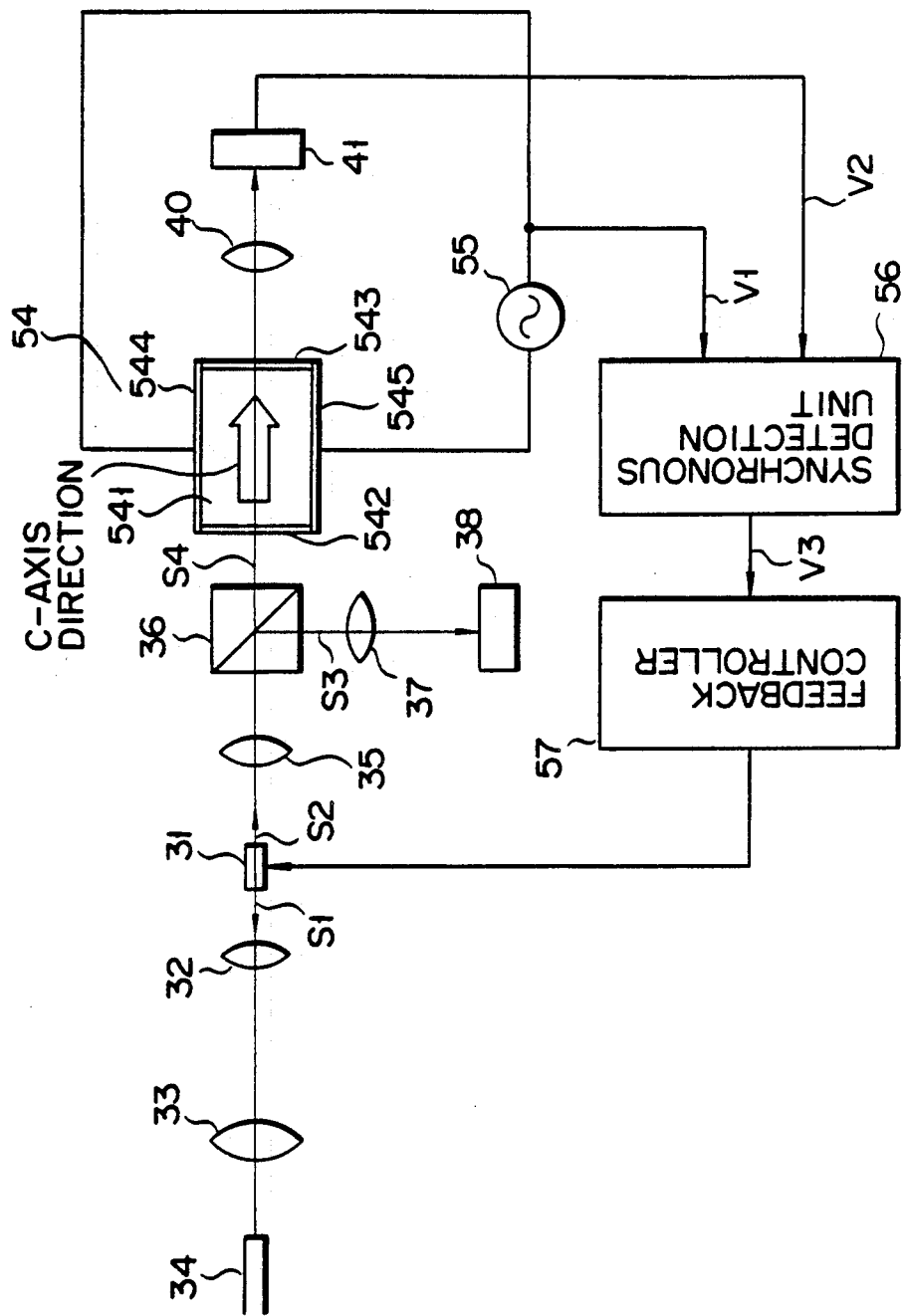
FIG. 16 is a view showing an arrangement of a semiconductor laser module and the first embodiment of its laser wavelength control apparatus according to the present invention.

FIG. 16 shows a semiconductor laser module and the first embodiment of its laser wavelength control apparatus according to the present invention. FIG. 16 shows an arrangement which is designed to control the oscillation wavelength of the semiconductor laser 31 in the semiconductor laser module shown in FIG. 5. The same reference numerals in FIG. 16 denote the same parts as in FIG. 15, and only different portions will be described below.

Referring to FIG. 16, a bulk 541 of a Fabry-Perot resonator 54 used in this embodiment is formed into a rectangular parallelepiped shape having square or rectangular end faces, and dielectric multilayer films are respectively deposited on both the end faces (each having a Z-cut surface which is cut in the Z-axis direction (perpendicular to the C-axis direction)) of the bulk 541 so as to form reflect filters 542 and 543. A pair of electrode plates 544 and 545 are attached to a pair of side surfaces (X-cut surfaces cut in the X-axis direction) which are perpendicular to the Z-cut surfaces and are opposite to each other. This pair of electrode plates 544 and 545 are connected to the output terminal of an AC power source 55. With this arrangement, an AC signal $V_1$ from the AC power source 55 is applied to the electrode plates 544 and 545 so as to apply an electric field $E_X$ in the X-axis direction, thus linearly polarizing incident light $S_4$ in the X- or Y-axis direction.

An output from a second photodetector 41 is supplied to a synchronous detection unit 56 together with an output from an AC power source 55. The synchronous detection unit 56 serves to perform synchronous detection by multiplying an output $V_2$ from the second photodetector 41 by an AC input $V_1$ and removing high-frequency components from the product, and to output the detection result as an error signal to a feedback controller 57. The feedback controller 57 amplifies the input error signal by a predetermined feedback gain and changes an injection current (or temperature) for determining the oscillation wavelength of the semiconductor laser 31 in accordance with the value of the feedback gain, thus controlling the error signal to be zero.

Figure 17:
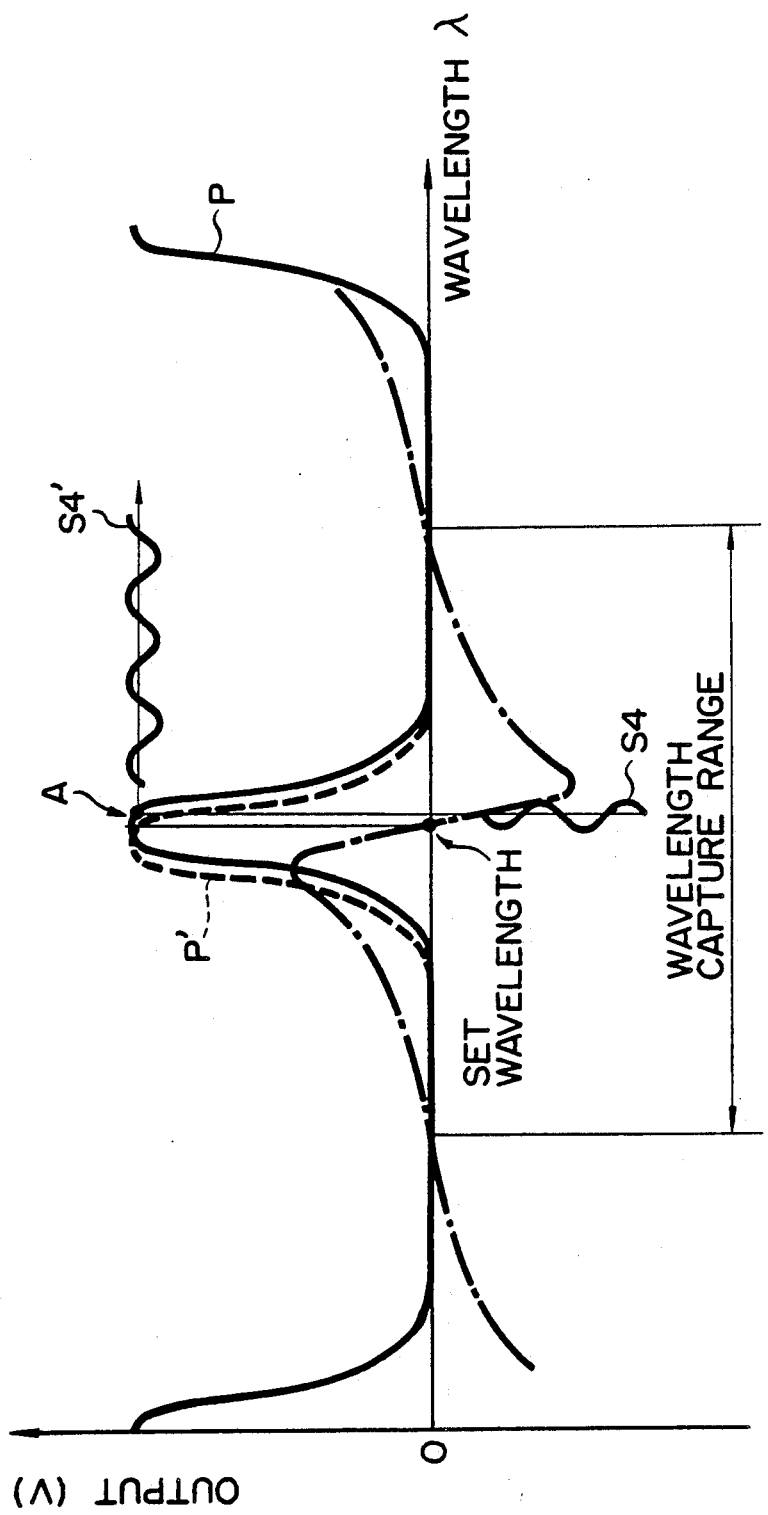
FIG. 17 is a graph, showing the wavelength-output characteristics of each component, for explaining an operation.

An operation of the semiconductor laser module and its laser wavelength control apparatus having the above-described arrangement will be described with reference to FIG. 17 which shows the wavelength characteristics of an output from each component. Referring to FIG. 17, a solid curve p represents the transmission characteristics of the Fabry-Perot resonator 54 using a crystallized quartz etalon, which have periodic peaks. Assume that the semiconductor laser 31 is oscillated at a wavelength indicated by a point A in FIG. 17. Since the AC signal $V_1$ having a predetermined frequency is applied to the bulk 541, its transmission characteristics p vary by a small amount, as indicated by a dotted curve p'. Therefore, light $S_4$ which is incident on the second photodetector 41 through the Fabry-Perot resonator 54 is modulated to light $S_4'$ by transmission characteristics p - p' of the Fabry-Perot resonator 54. If the AC signal $V_1$ applied to the bulk 541 is given as $$V_1 = a \cdot \sin \omega t \tag{14}$$

then, an AC component $V_2$ extracted from the second photodetector 41 is approximately represented by the following equation:

$$V_2 = -C(dp/d\lambda) a \cdot \sin \omega t \tag{15}$$

where C is a proportional constant, and $dp/d\lambda$ is a value obtained by differentiating the solid curve (the transmission characteristics of the bulk 541) p by a wavelength $\lambda$.

Since the output $V_3$ is obtained by calculating the product of the two signals $V_1$ and $V_2$ and removing high-frequency components therefrom, $$\begin{aligned} V_1 \times V_2 &= -C(dp/d\lambda) a^2 \sin^2 \omega t \\ &= -C(dp/d\lambda)(a^2/2)(1 - \cos 2\omega t) \\ \therefore V_3 &= -C(dp/d\lambda)(a^2/2) \end{aligned} \tag{16}$$

That is, the output $V_3$ from the synchronous detection unit 56 is proportional to the alternate long and dashed curve obtained by differentiating the solid curve p. The feedback controller 57 receives the output after this synchronous detection as the error signal V3, and controls the wavelength $\lambda$ of the semiconductor laser 31. Therefore, a set wavelength can be matched with the resonance wavelength of the Fabry-Perot resonator 54. As is apparent from FIG. 17 the set wavelength is located at the center of the wavelength capture range. In addition, as is apparent from equation (16), variations in sensitivity of the photodetector 40 and variations in amount of laser beam appear as variations in a and C. However, since the error signal is controlled to set $V_3 = 0$, these variations cause no variation in set wavelength. Therefore, the control apparatus having this arrangement is highly resistant to various types of drifts.

Figure 18:
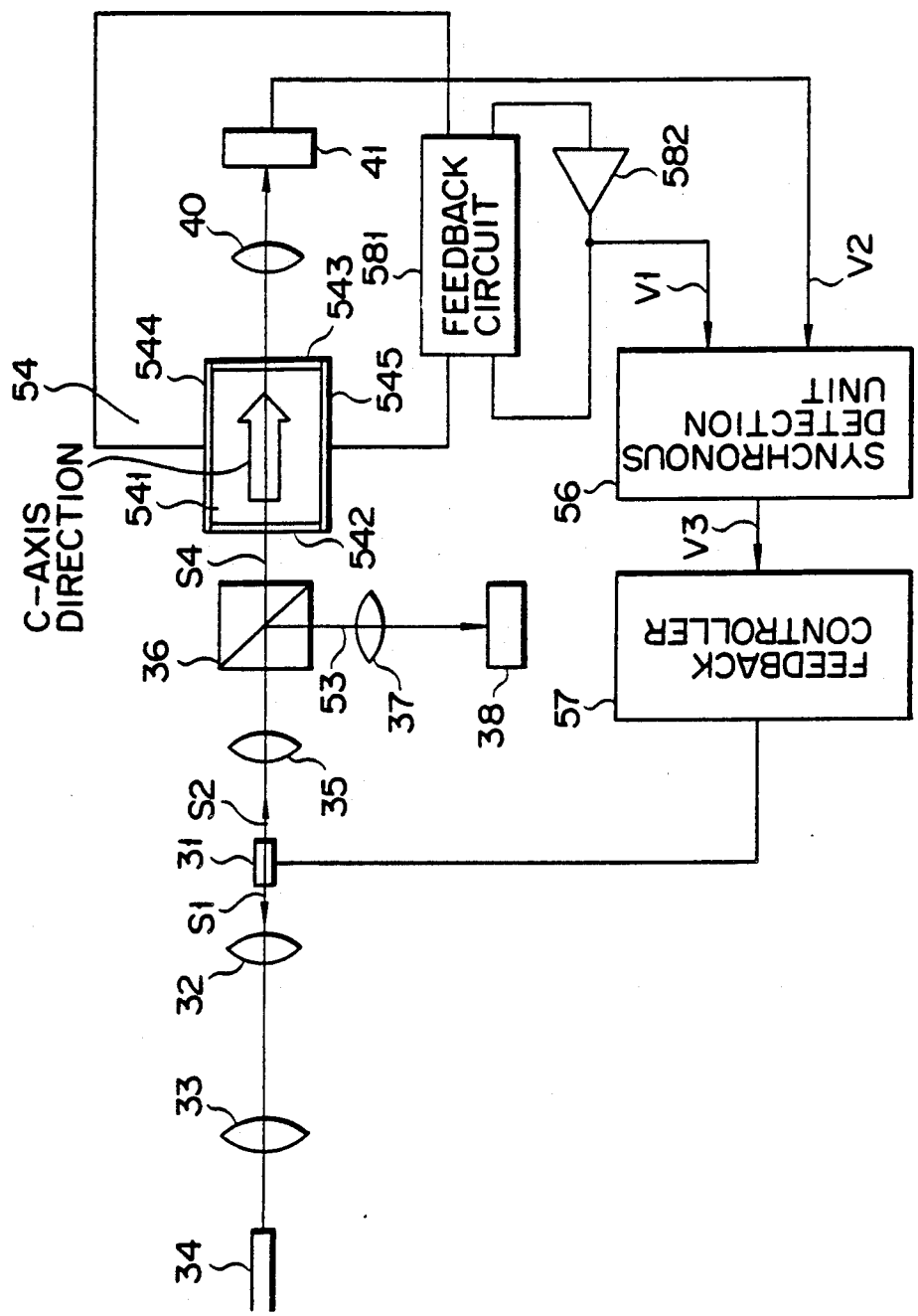
FIG. 18 is a view showing an arrangement of the second embodiment of a laser wavelength control apparatus according to the present invention, which is obtained by improving the laser wavelength control apparatus in FIG. 16.

FIG. 18 shows a semiconductor laser module and the second embodiment of its laser wavelength control apparatus according to the present invention, which has an arrangement obtained by improving the laser wavelength control apparatus shown in FIG. 16. The same reference numerals in FIG. 18 denote the same parts as in FIG. 16 and a description thereof will be omitted.

Since the bulk 541 used for the Fabry-Perot resonator 54 shown in FIG. 16 consists of crystallized quartz the bulk may be used as a crystal oscillator. In the embodiment shown in FIG. 18, a pair of electrodes 544 and 545 arranged on a bulk 541 are connected to a feedback circuit 581 so as to constitute a crystal oscillator together with an amplifier 582. In this arrangement, an oscillation signal is extracted from this oscillator and is input to a synchronous detection unit 56 together with an output from a second photodetector 41. According to this arrangement, since the bulk 541 is oscillated, as an oscillator, at a natural resonance frequency, the transmission characteristics of the crystal Fabry-Perot resonator can be effectively oscillated without adjusting a frequency.

In the embodiments shown in FIGS. 16 and 18, if an error signal is obtained by adding a proper offset voltage to an output after synchronous detection, a laser oscillation wavelength can be set near the resonance frequency of the Fabry-Perot resonator 54. In addition, the pair of electrode plates 544 and 545 need not always be attached to a side surface of the bulk 541. For example, these electrodes may be attached to the reflect filters 542 and 543 so that incident light $S_4$ is linearly polarized in the Y-axis direction upon application of an electric field $E_Z$ in the Z-axis direction. With this arrangement, the same effects as described above can be obtained. According to these embodiments, since a set wavelength is located at the center of the wavelength capture range, a stable feedback operation can be easily performed, and the fineness of the Fabry-Perot resonator can be improved to increase its sensitivity. In addition, since the laser wave-length control apparatus is not easily influenced by drifts of the optical detection system and the amplifier for amplifying a signal therefrom, and the like, the oscillation wavelength of a laser beam can be stabilized over a long period of time. Therefore, a semiconductor laser apparatus suitable for coherent optical communication and the like can be realized.

A laser wavelength can be further stabilized by combining the laser wavelength control apparatuses of the first and second embodiments with the respective embodiments shown in FIGS. 6, 8, 10, 11, and 13 as well as the embodiment shown in FIG. 5.

In a conventional semiconductor laser module, when a laser wavelength is to be stably controlled, a piezoelectric element is attached to one reflecting mirror of a Fabry-Perot resonator, and an AC signal is applied to the piezoelectric element so as to oscillate the reflecting mirror. Light emitted from the Fabry-Perot resonator, which is changed by this oscillation, is photoelectrically converted, and synchronous detection of the converted signal is performed with respect to the AC signal. A detection signal obtained in this manner is used as an error signal in such a manner that feedback control is performed on the basis of the error signal so as to change the injection current or temperature of the semiconductor laser.

In this arrangement, since the semiconductor module is easily influenced by temperatures as described above, it is generally assembled on a member which is stabilized in terms of temperature by using a Peltier element or the like. However, even with such a countermeasure against the influences of temperatures, the wavelength of the module varies upon influences of changes in external temperature. This is because heat is externally conducted to the piezoelectric element through feeder lines, and the length of the Fabry-Perot resonator varies due to the thermal expansion of the piezoelectric element.

Figure 1:
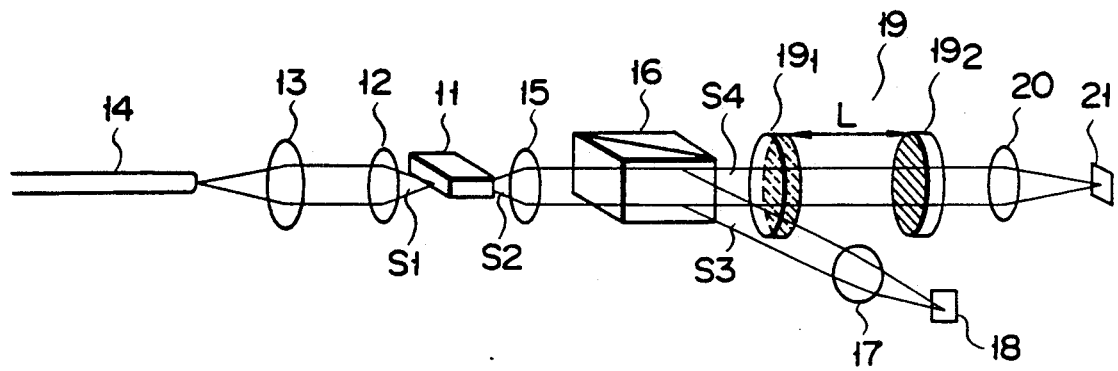
FIG. 1 is a view showing an arrangement of a conventional semiconductor laser module.
Figure 19:
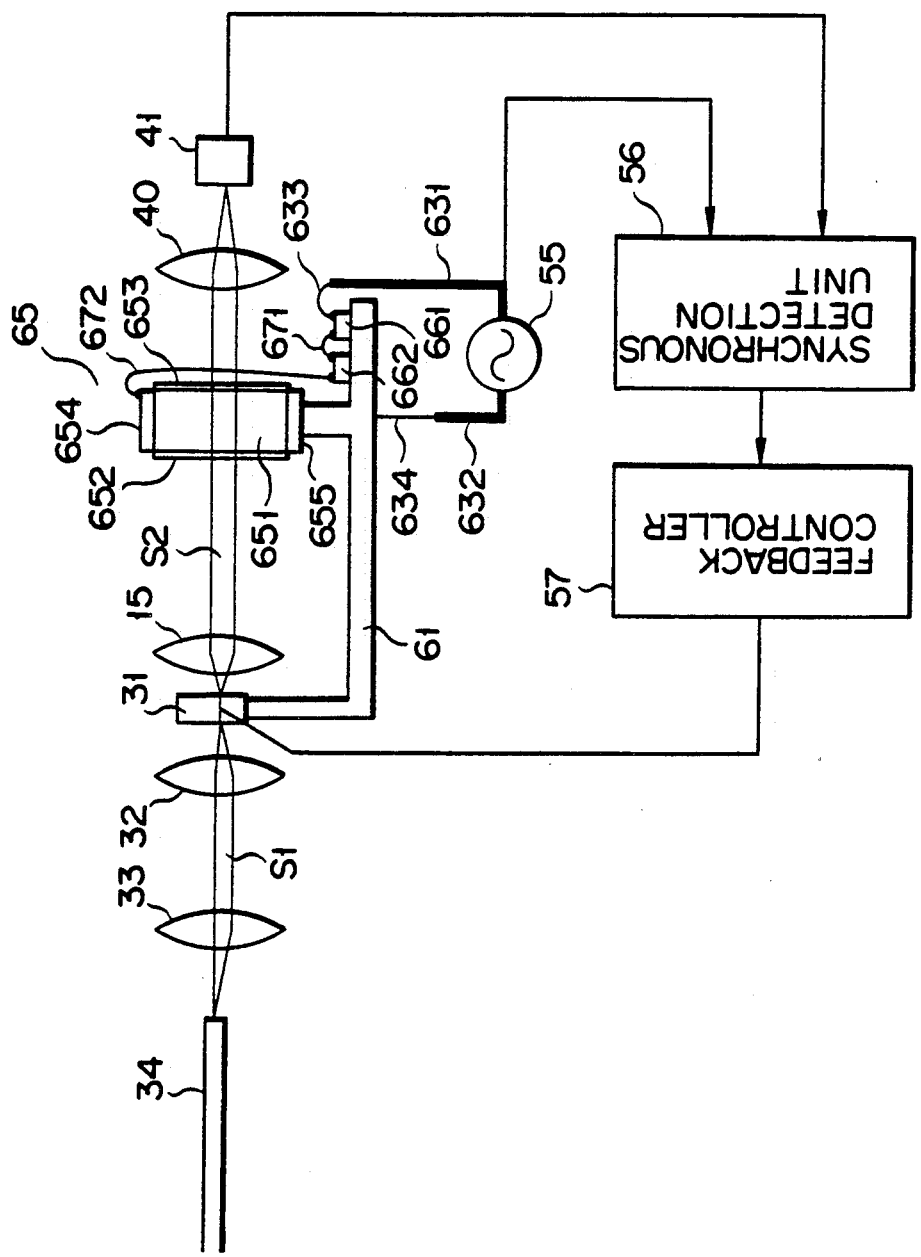
FIG. 19 is a view showing an arrangement of a semiconductor laser module and the third embodiment of its laser wavelength control apparatus according to the present invention.

FIG. 19 shows a semiconductor laser module and the third embodiment of its laser wavelength control apparatus according to the present invention, which is designed to solve this problem. In this arrangement, a Fabry-Perot resonator consists of a dielectric crystal having an electro-optic effect, e.g., the crystallized quartz in the above-described embodiments or LiNbO$_3$. That is, the present invention is applied to a case wherein modulation of an optical length is performed by using an electro-optic effect. The same reference numerals in FIG. 19 denote the same parts as in FIG. 16, and only a different part thereof will be described below. For the sake of a simple description, the beam splitter 36, the optical lens 37, and the first photodetector 38 in FIG. 1 are omitted, and the laser wave-length control apparatus in FIG. 16 is employed.

Referring to FIG. 19, a laser beam S$_1$ emitted from one end of a semiconductor laser 31 is focused on an optical fiber 34 through optical lenses 32 and 33. A laser beam S$_2$ emitted from the other end of the semiconductor laser 31 is collimated by an optical lens 35 and is then guided to a Fabry-Perot resonator 65. The laser beam S$_2$ is modulated by the resonator 65 and is received by a photodetector 41 through an optical lens 40.

Similar to the Fabry-Perot resonator shown in FIG. 16, the Fabry-Perot resonator 65 is designed such that dielectric multilayer films are respectively deposited on the opposite surfaces of a rectangular parallelepiped dielectric crystal 651, which are perpendicular to an optical path, so as to form reflecting surfaces 652 and 653, and electrode plates 654 and 655 are attached to opposite parallel surfaces of the crystallized quartz 651. The Fabry-Perot resonator 65 is fixed on a support base 61 which has excellent conductivity and is stabilized in terms of temperature. In this embodiment, in order to prevent the conduction of heat from an AC power source 55 to the Fabry-Perot resonator 65 through feeder lines 631 and 632, the First and second insulating pads 661 and 662 having excellent heat conductivity are formed on the support base 61. One feeder line 631 from the AC power source 55 is connected to a first pad 661 through a feeder line 633 having high heat resistance. The first pad 661 and a second pad 662, and the second pads 662 and one electrode plate 654 of the Fabry-Perot resonator 65 are respectively connected to each other through feeder lines 671 and 672 having high heat resistance. As a result, the feeder line 631 is connected to the electrode 654. The other feeder line 632 (on the GND side) from the AC power source 55 is connected to the lower portion of the support base 61 through a feeder line 634 having high heat resistance. The upper portion of the support base 61 is directly connected to the electrode plate 655 of the Fabry-Perot resonator 65.

According to the above-described arrangement, a change in external temperature which is conducted through the feeder line 631 located outside the module is absorbed by the support base 61 through the first and second insulating pads 661 and 662. A change in external temperature which is conducted through the feeder line 631 is directly absorbed by the support base 61. Since the feeder lines 671 to 672 and 633 to 634 have high heat resistance, the Fabry-Perot resonator 65 is thermally isolated from the outside perfectly. Therefore, the semiconductor laser 31 and the Fabry-Perot resonator 65 are free from the influences of external temperatures, and especially variations in length of the Fabry-Perot resonator 65 due to temperatures can be prevented. This enables stable wave-length control. In addition, if a plurality of pads or wire members having high heat resistance are used and the GND side of the AC channel is directly fixed to a temperature-stabilizing member, temperature stability can be further improved.

More stable laser wavelength control can be performed by combining the arrangements of the fourth and fifth embodiments with the arrangements shown in FIGS. 6, 8, 9, 10 and 13.

Additional advantages and modifications will readily occur to those skilled in the art. Therefore, the invention in its broader aspects is not limited to the specific details, and representative devices, shown and described herein. Accordingly, various modifications may by without departing from the spirit or scope of the general inventive concept as defined by the appended claims and their equivalents.

What is claimed is:

1. An apparatus for controlling the oscillation wavelength of a laser, comprising:

a semiconductor laser emitting a laser beam;

a Fabry-Perot resonator receiving said emitted laser beam including a crystallized quartz bulk having two flat surfaces which are perpendicular to a C-axis direction and parallel and opposite to each other, said Fabry-Perot resonator being provided with dielectric multi layer films respectively deposited on the flat surfaces so as to form reflect filters which enable stable wavelength control, and said crystallized quartz bulk being on an optical axis of one of said laser beams emitted from said semiconductor laser so that the C-axis direction is parallel to the optical axis of said semiconductor laser, thereby detecting a wavelength of incident light; and a photodetector receiving and photoelectrically converting light which is transmitted through said Fabry-Perot resonator to produce a signal connected to said semiconductor laser, thereby controlling the wavelength of said semiconductor laser.

2. An apparatus according to claim 1, wherein each of the dielectric multilayer films of said Fabry-Perot resonator has a packing density of not less than 0.98.

3. An apparatus according to claim 1, further comprising a package for storing and air-tightly sealing at least said semiconductor laser and said Fabry-Perot resonator.

4. An apparatus according to claim 3, wherein a high-purity inert gas is sealed in said package.

5. An apparatus according to claim 4, wherein the inert gas consists of nitrogen 6. An apparatus according to claim 1, further comprising a package for storing and air-tightly sealing said Fabry-Perot resonator.

7. An apparatus according to claim 6, wherein a high-purity inert gas is sealed in said package.

8. An apparatus according to claim 6, wherein the inert gas consists of nitrogen.

9. An apparatus according to claim 1, wherein said Fabry-Perot resonator is inclined with respect to an optical axis of incident light so as to deflect light, which is reflected by an incident side reflect filter, in an opposite direction toward a side on which said semiconductor laser is mounted while preventing incidence of the reflected light on a radiation surface of said semiconductor laser.

10. An apparatus according to claim 1, wherein said photodetector is a first photodetector and said apparatus further comprises:

light splitting means splitting a laser beam emitted from said semiconductor laser to said Fabry-Perot resonator;

a second photodetector receiving and photoelectrically converting a laser beam split by said light splitting means; and a feedback controller for detecting a level difference between detection signals output from said first and second photodetectors, generating a detection signal as an error signal, and controlling an oscillation wavelength of said semiconductor laser so as to decrease the error signal.

11. An apparatus according to claim 1, wherein said Fabry-Perot resonator is formed into a rectangular parallelepiped shape and comprises electrode plates respectively attached to a pair of surfaces parallel to the C axis, and said semiconductor laser apparatus further comprises:

an AC power source for applying an AC signal to the electrode plates of said Fabry-Perot resonator;

a synchronous detection circuit performing synchronous detection of a detection signal output from said photodetector receiving and photoelectrically converting a laser beam which is transmitted through said Fabry-Perot resonator on the basis of the AC signal output from said AC power source; and a feedback controller identifying a detection signal from said synchronous detection circuit with an error signal, and controlling an oscillation wavelength of said semiconductor laser so as to decrease the error signal.

12. An apparatus according to claim 11, further comprising connecting means, having not less than one electrode pad whose temperature is stabilized, for connecting the electrode plates of said Fabry-Perot resonator to said AC power source through the electrode pads 13. An apparatus according to claim 12, wherein said connecting means uses wire members for feeder lines for connecting said pads to said electrode plates, said wire members being higher in heat resistance than wire members for feeder lines for connecting said pads to said AC power source.

14. An apparatus according to claim 1, wherein said Fabry-Perot resonator is formed into a rectangular parallelepiped shape and comprises electrode plates attached to a pair of surfaces parallel to the C axis and said semiconductor laser apparatus further comprises:

a synchronous detection circuit, connected to the electrode plates of said Fabry-Perot resonator and constituting an oscillation circuit having the crystallized quartz bulk as an oscillator, performing synchronous detection of a detection signal output from said photodetector receiving and photoelectrically converting a laser beam which is transmitted through said Fabry-Perot resonator on the basis of an oscillation signal generated by said oscillation circuit; and a feedback controller identifying a detection signal from said synchronous detection circuit with an error signal, and controlling an oscillation wavelength of said semiconductor laser so as to decrease the error signal.

15. An apparatus for controlling the oscillation wavelength of a laser, comprising:

a semiconductor laser emitting a laser beam;

a Fabry-Perot resonator receiving said emitted laser beam and having two types bulk having different temperature coefficients bonded to each other and formed into a bulk assembly by dielectric multilayer films being respectively deposited on two flat surfaces of said bulk assembly, which are parallel and opposite to each through bonding surfaces of said bulks, thereby forming reflect filters which enables stable wavelength control, said bulk assembly being on an optical axis of one of said laser beams emitted from said semiconductor laser so that the flat surfaces are perpendicular to the optical axis of said semiconductor laser, thereby detecting a wavelength of incident light; and a photodetector receiving and photoelectrically converting light which is transmitted through said Fabry-Perot resonator to produce a signal connected to said semiconductor laser, thereby controlling the wavelength of said semiconductor laser.

16. An apparatus according to claim 15, wherein one of the bulks of said Fabry-Perot resonator consists of crystallized quartz and the other bulk consists of rutile.

17. An apparatus according to claim 15, wherein one of the bulks of said Fabry-Perot resonator consists of fused silica and the other bulk consists of rutile.

18. An apparatus according to claim 15, wherein each of the dielectric multilayer films of said Fabry-Perot resonator has a packing density of not less than 0.90.

19. An apparatus according to claim 15, further comprising a package for storing and air-tightly sealing at least said semiconductor laser and said Fabry-Perot resonator.

20. An apparatus according to claim 19, wherein a high-purity inert gas is sealed in said package.

21. An apparatus according to claim 20, wherein the inert gas consists of nitrogen.

22. An apparatus according to claim 15, further comprising a package for storing and air-tightly sealing said Fabry-Perot resonator.

23. An apparatus according to claim 22, wherein a high-purity inert gas is sealed in said package.

24. An apparatus according to claim 22, wherein the inert gas consists of nitrogen 25. An apparatus according to claim 15, wherein said Fabry-Perot resonator is inclined with respect to an optical axis of incident light so as to deflect light, which is reflected by an incident side reflect filter, in an opposite direction toward a side on which said semiconductor laser is mounted while preventing incidence of the reflected light on a radiation surface of said semiconductor laser.

26. An apparatus according to claim 15, wherein said photodetector is a first photodetector and said apparatus further comprises:
light splitting means splitting a laser beam emitted from said semiconductor laser to said Fabry-Perot resonator;
a second photodetector receiving and photoelectrically converting a laser beam split by said light splitting means; and
a feedback controller detecting a level difference between detection signals output from said first and second photodetectors, generating a detection signal as an error signal, and controlling an oscillation wavelength of said semiconductor laser so as to decrease the error signal.

27. An apparatus according to claim 15, wherein said Fabry-perot resonator is formed into a rectangular parallelepiped shape and comprises a pair of electrode plates respectively attached to opposite surfaces of said rectangular parallelepiped shape, and said semiconductor laser apparatus further comprises:
an AC power source applying an AC signal to the pair of electrode plates of said Fabry-Perot resonator;
a synchronous detection circuit performing synchronous detection of a detection signal output from said photodetector receiving and photoelectrically converting a laser beam which is transmitted through said Fabry-perot resonator; on the basis of the AC signal output from said AC power source; and
a feedback controller identifying a detection signal from said synchronous detection circuit with an error signal, and controlling an oscillation wavelength of said semiconductor laser so as to decrease the error signal.

28. An apparatus according to claim 27, further comprising connecting means, having not less than one electrode pad whose temperature is stabilized, connecting the pair of electrode plates of said Fabry-Perot resonator to said AC power source through the electrode pads.

29. An apparatus according to claim 28, wherein said connecting means uses wire members for feeder lines connecting said pads to said electrode plates, said wire members being higher in heat resistance than wire members for feeder lines for connecting said pads to said AC power source.

30. An apparatus according to claim 15, wherein said Fabry-Perot resonator is formed into a rectangular parallelepiped shape and comprises a pair of electrode plates attached to opposite surfaces of said rectangular parallelepiped shape, and said semiconductor laser apparatus further comprises:
a synchronous detection circuit, connected to the pair of electrode plates of said Fabry-Perot resonator and constituting an oscillation circuit having the crystallized quartz bulk as an oscillator, performing synchronous detection of a detection signal output from said photodetector receiving and photoelectrically converting a laser beam which is transmitted through said Fabry Perot resonator on the basis of an oscillation signal generated by said oscillation circuit; and
a feedback controller for identifying a detection signal from said synchronous detection circuit with an error signal, and controlling an oscillation wavelength of said semiconductor laser so as to decrease the error signal.

* * * * *